(12) United States Patent
Steenwyk et al.

(10) Patent No.: US 8,059,409 B2
(45) Date of Patent: Nov. 15, 2011

(54) AVIONICS CHASSIS

(75) Inventors: Meredith Marie Steenwyk, Kentwood, MI (US); Danny Weldon Coxon, Conklin, MI (US); John Jay Streyle, Walker, MI (US); Benjamin Jon Vander Ploeg, Kentwood, MI (US)

(73) Assignee: General Electric Company, Schenectady, NY (US)

( * ) Notice: Subject to any disclaimer, the term of this patent is extended or adjusted under 35 U.S.C. 154(b) by 222 days.

(21) Appl. No.: 12/487,797

(22) Filed: Jun. 19, 2009

(65) Prior Publication Data
US 2010/0321891 A1 Dec. 23, 2010

(51) Int. Cl.
*H05K 7/20* (2006.01)

(52) U.S. Cl. ........ 361/710; 361/707; 361/708; 361/709; 361/714; 361/697

(58) Field of Classification Search .......... 361/707–710, 361/714, 697
See application file for complete search history.

(56) References Cited

U.S. PATENT DOCUMENTS

| | | |
|---|---|---|
| 494,753 A | 4/1893 | Brooks |
| 3,989,984 A | 11/1976 | Amason et al. |
| 4,118,756 A | 10/1978 | Nelson et al. |
| 4,229,687 A | 10/1980 | Newman |
| 4,237,514 A | 12/1980 | Cline |
| 4,628,402 A | 12/1986 | Covey |
| H526 H | 9/1988 | Miller |
| 4,802,532 A | 2/1989 | Dawes et al. |
| 4,867,235 A | 9/1989 | Grapes et al. |
| 4,953,058 A | 8/1990 | Harris |
| 4,958,257 A | 9/1990 | Wenke |
| 4,974,317 A | 12/1990 | Rodriguez, II et al. |
| 5,077,637 A | 12/1991 | Martorana et al. |
| 5,128,689 A | 7/1992 | Wong et al. |
| 5,343,361 A | 8/1994 | Rudy, Jr. et al. |
| 5,376,011 A | 12/1994 | Rudy, Jr. et al. |
| 5,390,734 A * | 2/1995 | Voorhes et al. ............... 165/185 |
| 5,471,367 A | 11/1995 | Krumweide et al. |
| 5,485,353 A | 1/1996 | Hayes et al. |
| 5,513,070 A * | 4/1996 | Xie et al. ..................... 361/700 |
| 5,520,976 A | 5/1996 | Giannetti et al. |
| 5,566,752 A * | 10/1996 | Arnold et al. ................. 165/185 |

(Continued)

FOREIGN PATENT DOCUMENTS
EP 0390600 A2 10/1990
(Continued)

OTHER PUBLICATIONS

Search Report under Section 17(5) issued in connection with related case GB1009835.8, Sep. 9, 2010.

(Continued)

*Primary Examiner* — Anatoly Vortman
(74) *Attorney, Agent, or Firm* — McGarry Bair PC

(57) ABSTRACT

An avionics chassis comprises a carbon fiber reinforced housing, a card rail for holding an electronic circuit board mounted to an interior surface of the housing, at least one heat-dissipating fin composed of carbon fiber and extending from the outer surface of the housing, a plurality of isotropic carbon fibers extending from an interior of the fin through the housing and in abutting contact with the card rail. The plurality of isotropic fibers form a direct conductive path from the card rail to the heat-dissipating fin.

18 Claims, 11 Drawing Sheets

U.S. PATENT DOCUMENTS

| | | | |
|---|---|---|---|
| 5,698,316 A | 12/1997 | Kuras et al. | |
| 5,766,691 A * | 6/1998 | Arnold et al. | 427/450 |
| 5,825,621 A | 10/1998 | Giannatto et al. | |
| 5,825,624 A | 10/1998 | Arnold et al. | |
| 5,827,585 A | 10/1998 | Giannetti | |
| 5,949,650 A | 9/1999 | Bulante et al. | |
| 5,953,210 A | 9/1999 | Lo | |
| 6,018,460 A | 1/2000 | Borowiec et al. | |
| 6,026,565 A | 2/2000 | Giannatto et al. | |
| 6,028,769 A | 2/2000 | Zurek | |
| 6,052,280 A * | 4/2000 | Dilley et al. | 361/679.54 |
| 6,060,166 A | 5/2000 | Hoover et al. | |
| 6,097,597 A * | 8/2000 | Kobayashi | 361/679.47 |
| 6,110,847 A | 8/2000 | Yamamoto et al. | |
| 6,131,651 A | 10/2000 | Richey, III | |
| 6,212,075 B1 | 4/2001 | Habing et al. | |
| 6,246,582 B1 | 6/2001 | Habing et al. | |
| 6,286,591 B1 * | 9/2001 | Bonneville | 165/185 |
| 6,351,383 B1 | 2/2002 | Payton | |
| 6,367,509 B1 | 4/2002 | Bonneville et al. | |
| 6,452,093 B1 * | 9/2002 | Ishii et al. | 174/16.3 |
| 6,542,370 B1 * | 4/2003 | Wang et al. | 361/704 |
| 6,574,106 B2 | 6/2003 | Mori | |
| 6,620,471 B1 | 9/2003 | Do | |
| 6,661,664 B2 | 12/2003 | Sarno et al. | |
| 6,721,182 B1 | 4/2004 | Wells et al. | |
| 6,735,086 B1 | 5/2004 | Weber et al. | |
| 6,746,768 B2 | 6/2004 | Greinke et al. | |
| 6,758,263 B2 | 7/2004 | Krassowski et al. | |
| 6,765,798 B1 | 7/2004 | Ratliff et al. | |
| 6,771,502 B2 | 8/2004 | Getz, Jr. et al. | |
| 6,775,143 B2 | 8/2004 | Yen et al. | |
| 6,781,830 B2 | 8/2004 | Barth et al. | |
| 6,914,783 B2 | 7/2005 | Rogers et al. | |
| 6,994,155 B2 | 2/2006 | Dessiatoun et al. | |
| 7,005,573 B2 | 2/2006 | Lionetta et al. | |
| 7,092,255 B2 | 8/2006 | Barson et al. | |
| 7,168,484 B2 | 1/2007 | Zhang et al. | |
| 7,172,785 B2 | 2/2007 | Thompson et al. | |
| 7,307,840 B2 | 12/2007 | Hartung | |
| 7,325,772 B1 | 2/2008 | Hanewinkel, III et al. | |
| 7,333,335 B2 | 2/2008 | Hsieh | |
| 7,345,877 B2 * | 3/2008 | Asfia et al. | 361/700 |
| 7,349,221 B2 | 3/2008 | Yurko | |
| 7,365,974 B2 | 4/2008 | Hartung | |
| 7,460,367 B2 | 12/2008 | Tracewell et al. | |
| 7,508,670 B1 | 3/2009 | Thorson et al. | |
| 7,743,763 B2 * | 6/2010 | Grip et al. | 126/569 |
| 7,911,796 B2 * | 3/2011 | Vander Ploeg et al. | 361/707 |
| 2004/0070944 A1 | 4/2004 | Wells et al. | |
| 2005/0213306 A1 | 9/2005 | Vos et al. | |
| 2006/0109631 A1 | 5/2006 | Marro et al. | |
| 2007/0053168 A1 | 3/2007 | Sayir et al. | |
| 2007/0070601 A1 | 3/2007 | Vos et al. | |
| 2007/0097620 A1 | 5/2007 | Leech et al. | |
| 2008/0007890 A1 | 1/2008 | Harmon et al. | |
| 2008/0026179 A1 | 1/2008 | Shiao et al. | |
| 2008/0057303 A1 | 3/2008 | Tsushima et al. | |
| 2008/0311374 A1 | 12/2008 | Mittal et al. | |
| 2009/0034200 A1 | 2/2009 | Li et al. | |
| 2009/0147472 A1 | 6/2009 | Mantych et al. | |
| 2009/0178821 A1 | 7/2009 | Zavidniak et al. | |
| 2010/0046170 A1 | 2/2010 | Stevenson et al. | |
| 2010/0073882 A1 | 3/2010 | Yoshikawa et al. | |
| 2010/0319948 A1 * | 12/2010 | Vander Ploeg et al. | 174/2 |
| 2010/0321890 A1 * | 12/2010 | Streyel et al. | 361/704 |
| 2010/0321892 A1 * | 12/2010 | Vander Ploeg et al. | 361/707 |

FOREIGN PATENT DOCUMENTS

| | | |
|---|---|---|
| EP | 0564315 A1 | 10/1993 |
| EP | 0632688 A2 | 1/1995 |
| EP | 0715492 A2 | 6/1996 |
| EP | 2025704 A1 | 2/2009 |
| EP | 2159257 A1 | 3/2010 |
| GB | 2042809 A | 9/1980 |
| GB | 2145290 A | 3/1985 |
| JP | 7297506 A | 11/1995 |
| WO | 0041450 A1 | 7/2000 |
| WO | 0149092 A1 | 7/2001 |
| WO | 2008033297 A2 | 3/2008 |

OTHER PUBLICATIONS

U.S. Appl. No. 12/487,784, filed Jun. 19, 2009, Benjamin Jon Vander Ploeg.

U.S. Appl. No. 12/487,834, filed Jun. 19, 2009, John Jay Streyle.

U.S. Appl. No. 12/487,850, filed Jun. 19, 2009, Benjamin Jon Vander Ploeg.

International Search Report and Written Opinion issued in connection with PCT/US2010/034008, Sep. 24, 2010.

Search Report & Written Opinion from corresponding PCT/US2010/033721, Mar. 2, 2011.

Search Report & Written Opinion from corresponding PCT/US2010/035177, May 16, 2011.

\* cited by examiner

AVIONICS CHASSIS

GOVERNMENT LICENSE RIGHTS

This invention was made with Government support under Purchase Order No. 4CC1766 awarded by Department of the Air Force, Air Force Research Laboratory. The Government has certain rights in this invention.

CROSS-REFERENCE TO RELATED APPLICATIONS

This application is related to patent application Ser. No. 12/487,784, entitled Avionics Chassis, patent application Ser. No. 12/487,834, entitled Avionics Chassis, and patent application Ser. No. 12/487,850, entitled Avionics Chassis, filed concurrently herewith.

BACKGROUND OF THE INVENTION

Contemporary aircrafts use avionics in order to control the various equipment and operations for flying the aircraft. The avionics may be stored in an avionics chassis, which performs several beneficial functions, some of which are: electrically shielding the avionics from electromagnetic interference (EMI), protecting the avionics from lightning strikes, dissipating the heat generated by the avionics, and protecting the avionics from environmental exposure.

Weight is also a consideration for the avionics chassis. The avionics chassis should perform the beneficial functions without unnecessarily adding weight to the aircraft.

The performance of the beneficial functions is often inapposite to maintaining or reducing the weight of the avionics chassis, especially in light of newer avionics having faster processing speeds and higher frequencies, smaller size, and greater power densities. These avionics generate relatively large amounts of heat, but operate only under a certain range of threshold temperatures, which leads to an increased heat-dissipating requirement that has been previously addressed by increasing the size of the heat sink, leading to an increased weight.

Historically, commercially available avionics chassis are made of aluminum, which inherently has the desired shielding, heat dissipating, lightning strike protection, and environmental protection benefits.

BRIEF DESCRIPTION OF THE INVENTION

In one embodiment, an avionics chassis comprises a carbon fiber reinforced housing, a card rail for holding an electronic circuit board mounted to an interior surface of the housing, at least one heat-dissipating fin composed of carbon fiber and extending from the outer surface of the housing, a plurality of isotropic carbon fibers extending from an interior of the fin through the housing and in abutting contact with the card rail. The plurality of isotropic fibers form a direct conductive path from the card rail to the heat-dissipating fin.

DETAILED DESCRIPTION OF THE INVENTION

Figure 1:
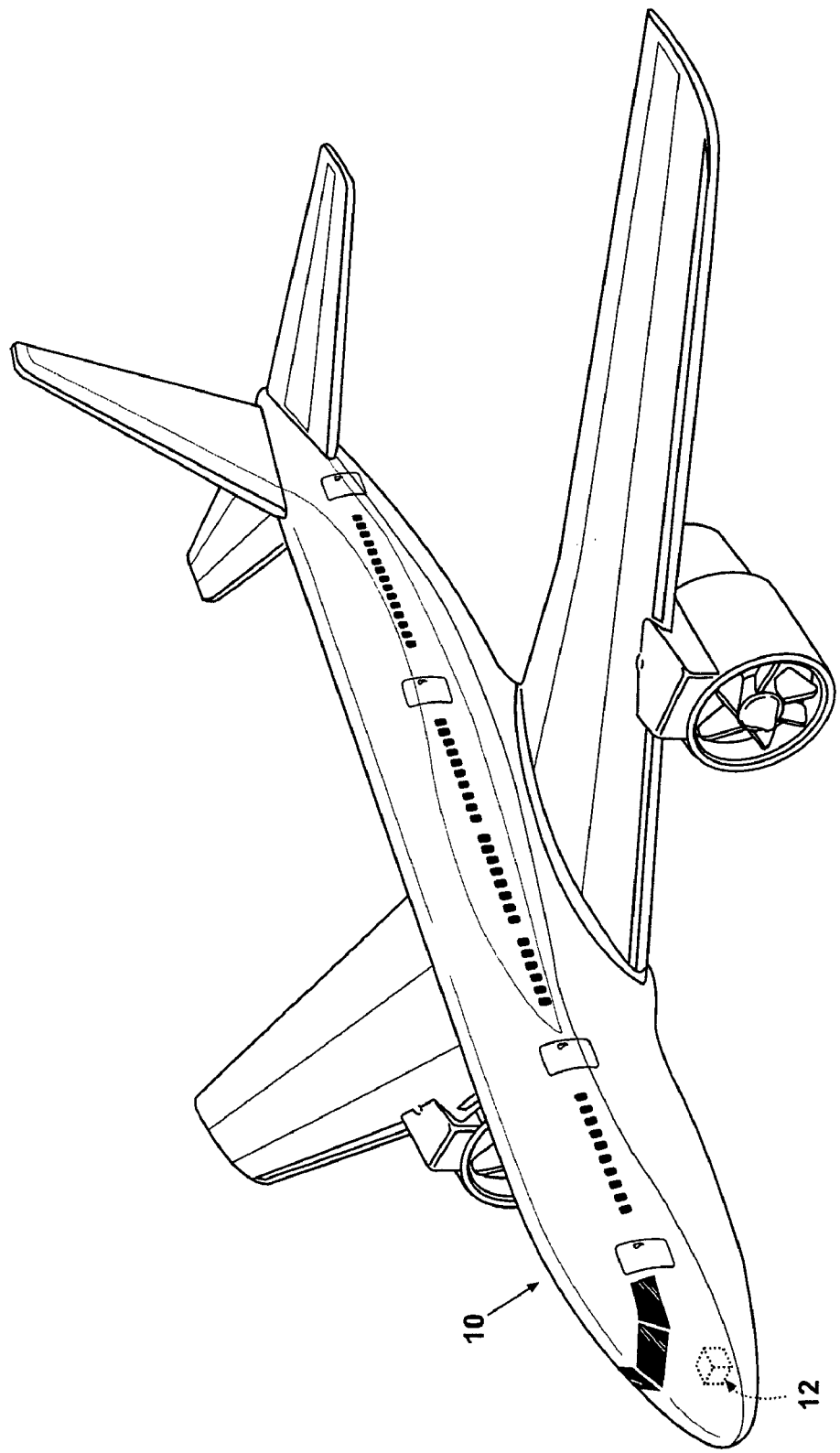
FIG. 1 is a schematic view of an aircraft having an avionics chassis according to the invention.

FIG. 1 schematically illustrates an aircraft 10 with an on-board avionics chassis 12 (shown in phantom) for housing avionics for use in the operation of the aircraft 10. The avionics chassis 12 houses a variety of avionics elements and protects them against contaminants, electromagnetic interference (EMI), radio frequency interference (RFI), vibrations, and the like. While illustrated in a commercial airliner, the avionics chassis 12 can be used in any type of aircraft, for example, without limitation, fixed-wing, rotating-wing, rocket, commercial aircraft, personal aircraft, and military aircraft. The avionics chassis 12 may be located anywhere within the aircraft, not just the nose as illustrated.

Figure 2:
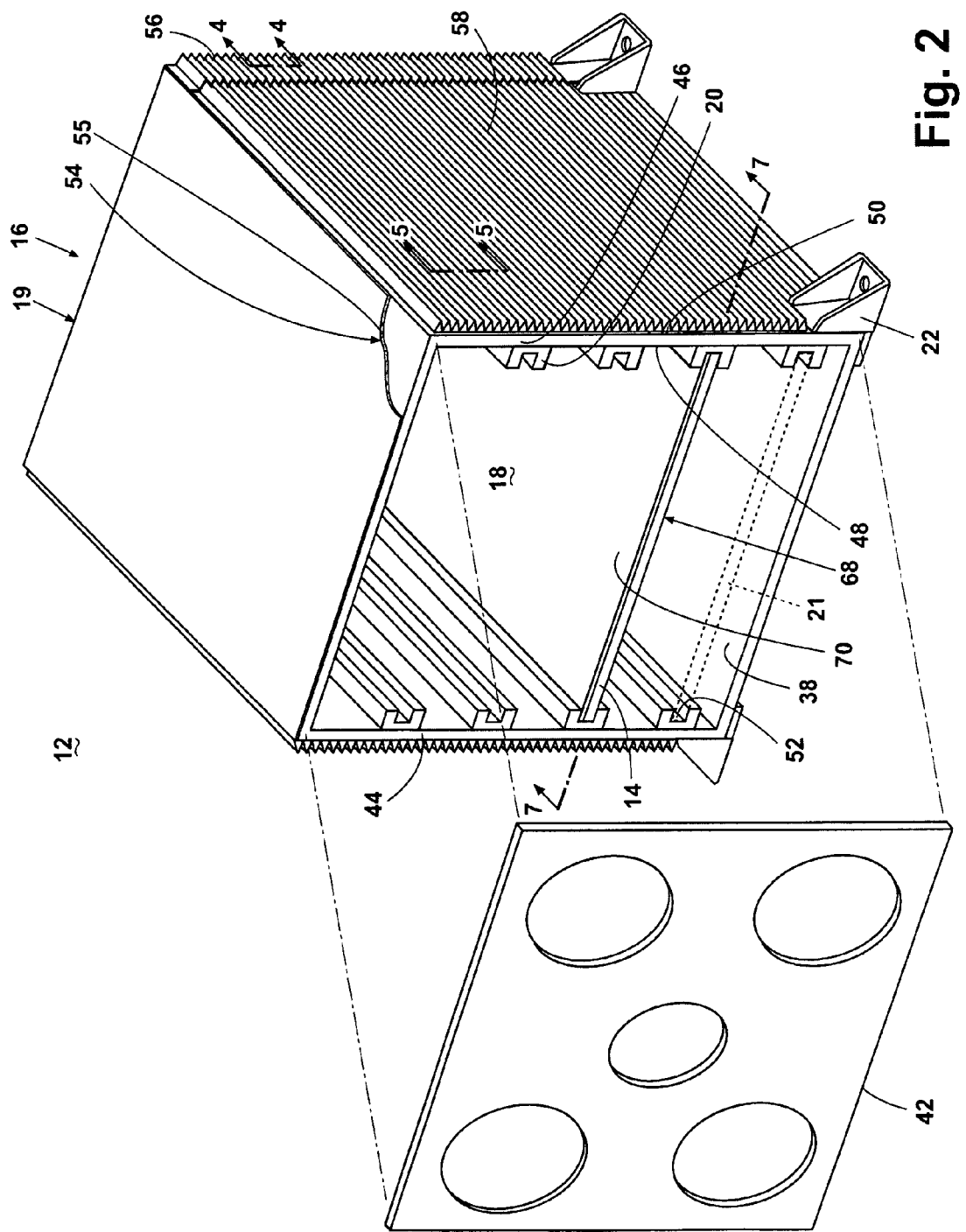
FIG. 2 is a perspective view of the avionics chassis according to one embodiment of the invention, with a cover removed for clarity.

FIG. 2 illustrates the avionics chassis 12 according to one embodiment of the invention, with a front cover 42 removed. The avionics chassis 12 includes a chassis housing 16 that defines an interior 18 and exterior 19. Pluralities of thermally conductive card rails 20 define effective slots 21 (illustrated by the dotted lines) there between for receiving printed circuit boards (PCBs) 14. Mounting feet 22 extend from the chassis housing 16 to facilitate mounting the avionics chassis 12 to the aircraft 10 by means of bolts or other conventional fasteners. Further, the mounting feet 22, can function as an electrical ground for grounding the avionics chassis to the frame of the aircraft 10. While mounting feet 22 are shown in this example the avionics chassis 12 can be used with any type of attachment mechanism.

Figure 3:
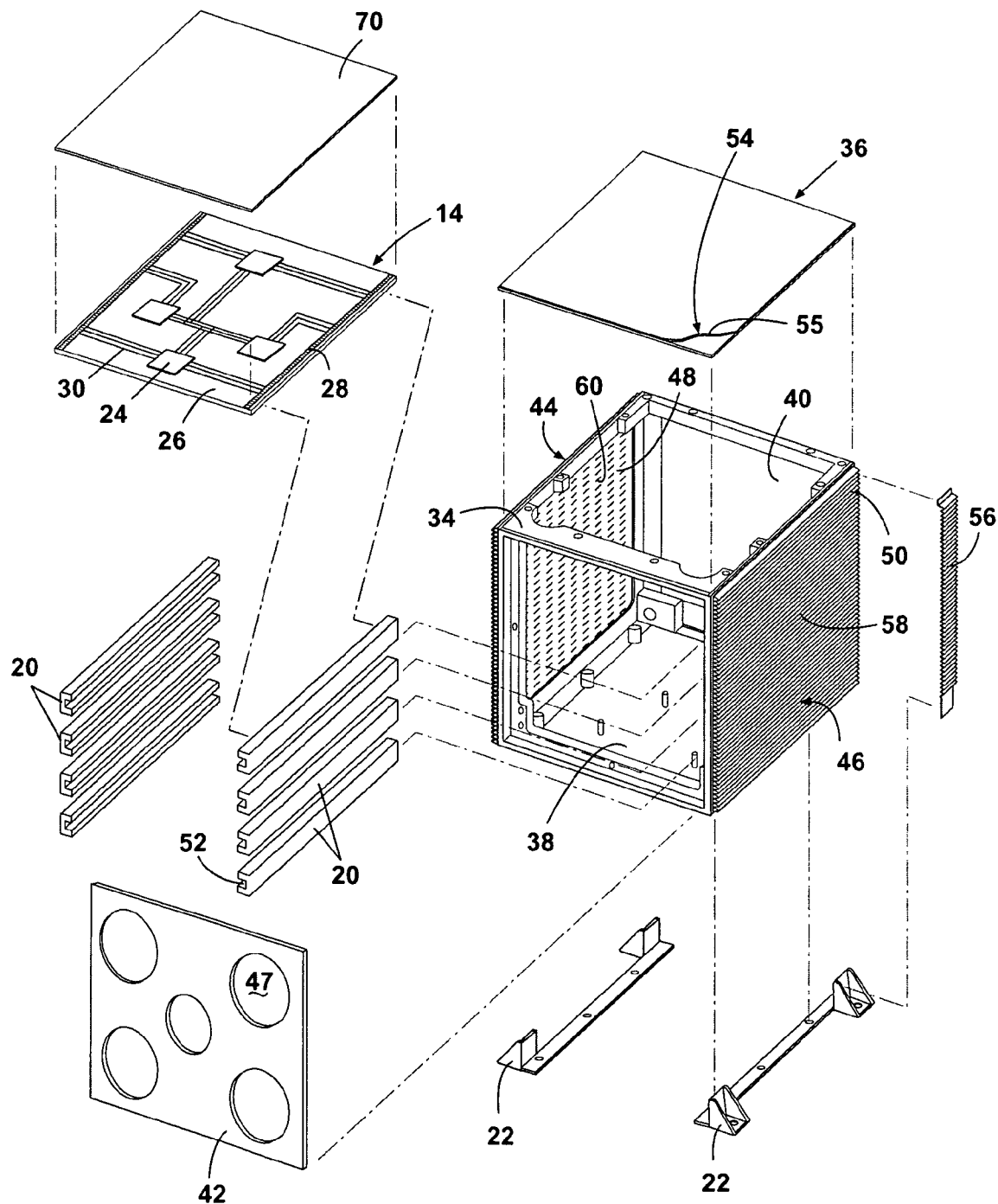
FIG. 3 is an exploded view of the avionics chassis shown in FIG. 2.

FIG. 3 illustrates the avionics chassis 12 and the PCB 14 in more detail. For purposes of this description, it is noted that the PCB 14 may have negative characteristics for an avionics chassis environment, such as heat producing and radio wave sensitivity, which the chassis 12 is designed to address. The PCB 14 includes heat producing circuitry and/or at least one heat-producing component 24, such as a semiconductor chip, that is mounted on and supported by a substrate 26, which is generally thermally non-conductive. The PCB 14 may be provided with thermally conductive side strips 28 located along the exterior edges of the PCB 14. Thermally conductive elements or interior paths 30 may be provided on the substrate 26 and/or in the interior of the PCB 14. The interior paths 30 create a thermally conductive path from the heat producing component 24 to the thermally conductive side strips 28 to provide a direct thermal pathway from the interior to the periphery of the substrate 26. The side strips 28 then provide a thermal pathway to the card rails 20. The interior paths 30 can be one or more metal strips, typically copper, or other conductive material formed in or provided on the substrate 26.

As illustrated in FIG. 3, the chassis housing 16 comprises a frame 34 having a top cover 36, a bottom wall 38, a back wall 40, and opposing side walls 44 and 46, collectively referred to as the walls. The side walls 44 and 46 have an interior surface 48 and an exterior surface 50. A plurality of heat-dissipating fins 58 may project from the walls and are illustrated as projecting from the exterior surface 50 of side walls 44 and 46. A removable front cover 42 includes openings 47 that may be configured for receiving a connector for connecting the one or more PCBs 14 to a wire harnesses or the like (not shown).

The frame 34 comprises both polyacrylonitrile (PAN) carbon fibers and pitch carbon fibers in an epoxy matrix. PAN fibers, compared to pitch fibers, have a very high strength and small diameter, which makes them suitable for use at the various radii of the frame 34. However, PAN fibers, compared to pitch fibers, have a low thermal conductivity. Thus, the use of PAN fibers in the frame 34 results in the frame 34 being very strong, and satisfying the strength requirements for the avionics chassis 12. The frame 34 has an undesirably low thermal conductivity, largely due to an insulative matrix, which is not capable in and of itself of conducting the heat that is anticipated to be generated by the PCBs 14.

The walls are made with pitch fibers, which have a high stiffness to help meet mechanical requirements for the avionics chassis 12. The pitch fibers are not as strong as PAN fibers, so they are more prone to breaking under stress or during manufacturing. While the walls are not as strong as the frame 34, they need not be because the frame 34 provides the primary source of strength for the avionics chassis 12. The use of pitch fibers helps reduce wall thickness with no loss in stiffness, and the PAN fibers in the frame 34 help maintain mechanical requirements. The pitch fibers have a higher thermal conductivity than the PAN fibers. Thus, the walls provide more thermal conductivity than the frame 34.

The carbon composite has a lower density than traditionally-used aluminum, which reduces the material weight in the avionics chassis 12 while still providing the required strength and stiffness. Because the composite has a much lower density, the weight of the chassis housing 16 may be reduced a substantial amount. For example, avionics chassis made according to this embodiment have resulted in about a 40% weight reduction. The amount of reduction may vary depending on the mechanical requirements for a particular avionics chassis 12.

In forming the frame 34, top cover 36, bottom wall 38, back wall 40, and opposing side walls 44 and 46, a dry lay-up method or pre-preg process of constructing carbon composites may be used with both the pitch and PAN carbon fibers. In such a process, the carbon fiber material is already impregnated with the epoxy (pre-preg) and may be applied to a female or male mold. Pre-preg lay-up is a relatively inexpensive, common process that is low cost and well suited for handling thin walled parts. In this embodiment, pre-preg was applied to a female mold.

Bladder molding or other suitable techniques may be used to exert pressure on the pre-preg composite material in the female mold or on the male mold, thereby forcing the composite material to take the shape of the mold. Using bladder molding in a female mold the frame 34, back panel 40, bottom panel 38, and side walls 44 and 46 of the avionics chassis 12 may be formed as an integral unit.

As an alternative to using bladder molding to exert pressure, an elastomeric male mandrel tool may be used. The elastomer expands when heated to create pressure and consolidate the composite in the female tool or mold. The heat-dissipating fins 58 may be separated by elastomeric spacers during cure and may thus be co-cured to the side walls 44 and 46 to achieve good consolidation, and walls flatness, eliminating seams, and improving thermal paths. Alternatively, the heat-dissipating fins 58 may be formed by machining. Any fittings or posts may be post-bonded to the interior 18.

The top cover 36 and front cover 42 may be produced through compression molding with matched metal tooling and may be suitably joined to the frame 34 using any convenient method such as fasteners, solders, brazes, welds, adhesives, and the like. For example, a structural adhesive may be used to hold the top cover 36 and front cover 42 to the frame 34. Then, to electrically seal the avionics chassis 12, an electrically conductive adhesive may be placed right next to the structural adhesive on the interior 18 of the avionics chassis 12.

The card rails 20 abut the interior surface 48 and may be fixedly mounted thereto. The card rails 20 can be attached to the interior surface 48 using any convenient method such as mechanical fasteners, solders, brazes, welds, adhesives, and the like. The card rails 20 may be arranged in pairs, with one card rail 20 residing on the side wall 44 and the other card rail 20 residing on the side wall 46 to effectively define a slot 21 extending between the pair of card rails 20. Parallelism between the pair of card rails 20 is necessary to ensure that the PCB 14 will slide into the slot 21 properly. Each of the card rails 20 has two legs that define a groove or channel 52, which partially defines the slot 21. The card rails 20 should be centered such that when the PCB 14 is inserted into the slot 21, the PCB 14 is supported by both of the card rails 20 forming the slot 21; this facilitates symmetric cooling of the PCB 14. The card rails 20 may be made of any suitable thermally conductive material including either machined or extruded aluminum, copper, aluminum/beryllium alloy, machined silicon carbide or a metal matrix composite.

A radio wave shield 54 is provided on the housing 16 to render the avionics chassis 12 EMI/RFI resistant. The radio wave shield 54 may comprise a metallic layer 55 provided on the housing 16. The radio wave shield 54 may be in the form of a metal deposition layer on the chassis housing 16. The deposition layer may be formed by chemical vapor deposition, physical vapor deposition, or electrodeposition. Further, the radio wave shield 54 may be formed by other means such as thermal sprayed metal, the use of a co-cured mesh, or the use of a metal foil. To properly attenuate the electromagnetic interference, the radio wave shield 54 covers or overlies at least the entire exterior of the avionics chassis 12. It may also be applied to the interior if needed. The radio wave shield 54 reflects the radio waves. While the composite material of the avionics chassis 12 absorbs some radio waves and provides some attenuation benefit, the wave shield 54 provides the necessary attenuation for practical purposes. The contemplated radio wave shield 54 attenuates the radio wave energy by at least 60 dB. The thickness of the metallic layer 55 for the selected material, is believed to be the main factor in attenuating the radio wave energy. A physical vapor deposition layer of aluminum having a thickness of 2-3 microns has been found to attenuate the radio wave energy at least 60 dB.

At least one lightning strike conductive path, comprising a metallic strip 56 is provided on the chassis housing 16 in addition to the exterior metal layer. The metallic strip 56 is illustrated as overlying the metallic layer 55 forming the radio wave shield 54. While illustrated as a single metallic strip 56, multiple strips may be used and it may extend around corners and on multiple components of the assembly. The metallic strip 56 extends to one or more of the feet 22, resulting in the metallic strip 56 forming a conductive path to the electrical ground. The single metallic strip 56 and/or the multiple metallic strips may extend to one or multiple feet 22 to provide multiple conductive paths to the electrical ground.

While the mounting feet 22 are illustrated as the grounding point for the avionics chassis 12. Other suitable grounding points may be used and include: grounding studs, grounding surfaces, grounding straps, metallic spring fingers, etc. to provide a grounding path. These may all be done totally independently of the mounting feet 22. It is contemplated that the avionics chassis 12 may not even have mounting feet 22 such as when mounting hooks and guide pins are used.

It has been contemplated that thermal sprayed aluminum, or another thermal sprayed metal, may be used to create the metallic strip 56. Thermal sprayed aluminum is applied by propelling molten aluminum at the avionics chassis 12 with expanding gasses. The molten metal quenches at impact and adheres to the avionics chassis 12 by mechanical interlock and diffusion bonding. Subsequent impacting aluminum builds the metallic strip 56 thickness. The metallic strip 56 is relatively thick compared to the metallic layer 55 of the radio wave shield 54, with a practical thickness of around 76 microns or greater.

Figure 4:
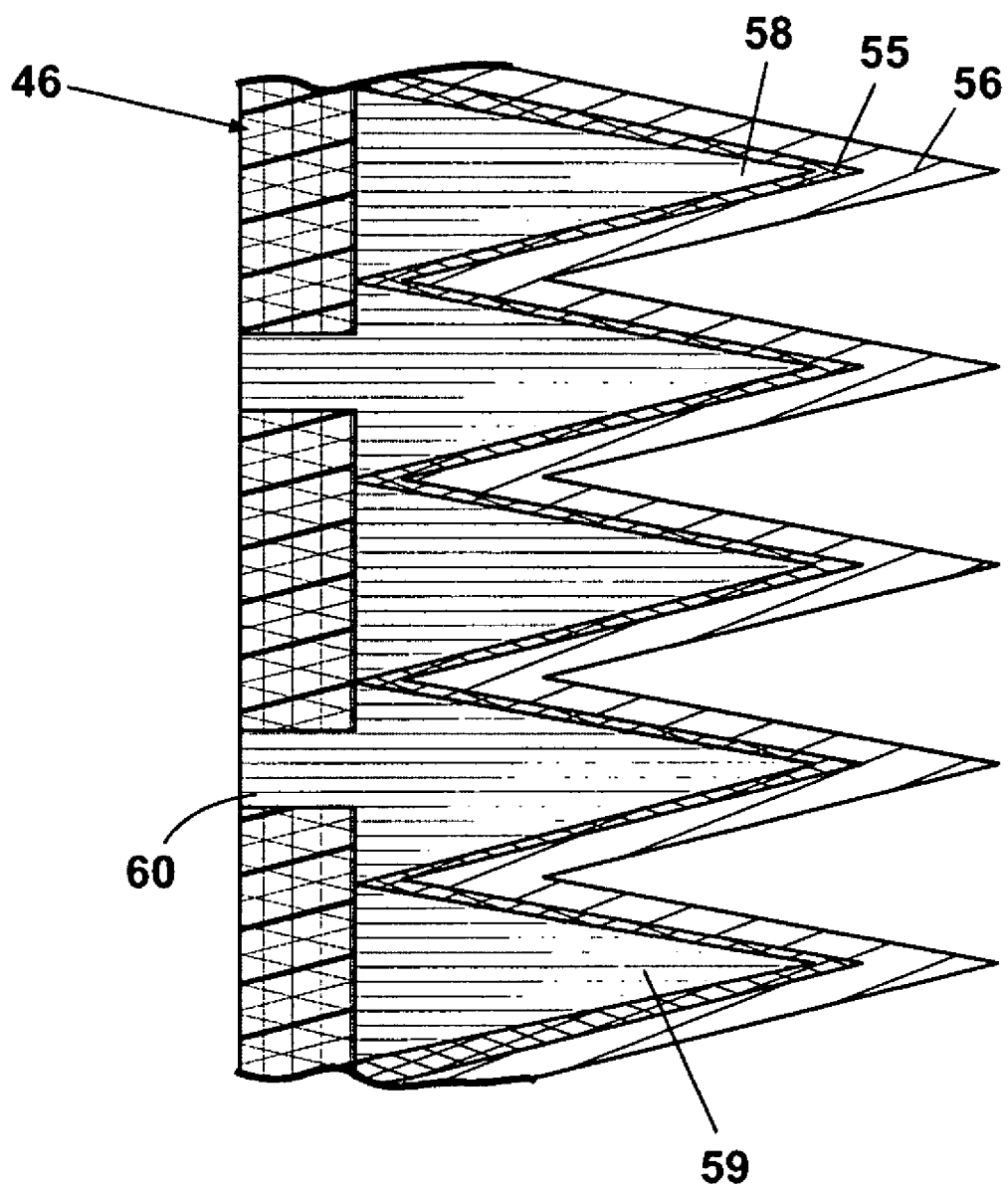
FIG. 4 is a cross-sectional view taken along the line 4-4 of a portion of the avionics chassis shown in FIG. 2.

The density and thickness of the metallic strip 56 should be selected to enable the current generated by a lightning strike to be quickly transmitted to the electrical ground without causing electro-migration or the fusing of the metallic strip 56. FIG. 4 illustrates a cross section of the metallic layer 55 and metallic strip 56 located on several of the heat-dissipating fins 58. The thickness of the metallic strip 56 is shown schematically as being thicker than the thickness of the metallic layer 55.

The thermal sprayed aluminum may also be applied over bonded joints on the avionics chassis 12. For example, where the mounting feet 22 are attached to the chassis housing 16. The thermal sprayed aluminum, or metallic strip 56, creates a continuous, intimately bonded conductive path between the chassis housing 16 and the mounting feet 22 and this helps to avoid slight gaps between the conductive paths, which could enable sparking. The electrical resistance between any locations on the avionics chassis 12, including the mounting feet 22, may not exceed 2.5 milliohms.

Unlike its metal counterparts, the carbon composite avionics chassis 12 does not inherently attenuate radio wave energy or conduct away the extreme electrical currents generated by lightning strikes. This is because the carbon fiber composite chassis housing 16 is significantly less electrically conductive than an aluminum chassis because of an electrically insulative composite matrix. In a carbon fiber composite avionics chassis 12 current from a lightning strike seeks the metal paths available, which can damage and even destroy onboard electronics that have not been electromagnetic field shielded or lightning protected. The metallic layer 54 described above is not always thick enough to handle a lighting strike. Also, a thick enough metal layer to provide lightning strike protection greatly and unnecessarily increases the weight of the avionics chassis 12.

The combination of different materials and thicknesses for the metallic layer 55 and metallic strip 56 provide for additional weight reduction, while still providing the desired radio wave shielding and lightning strike protection. The mixing of the metallic layer 55 and metallic strip 56 along with limiting their respective coverage area to that required to perform the desired function provides for a substantial weight reduction.

Figure 5:
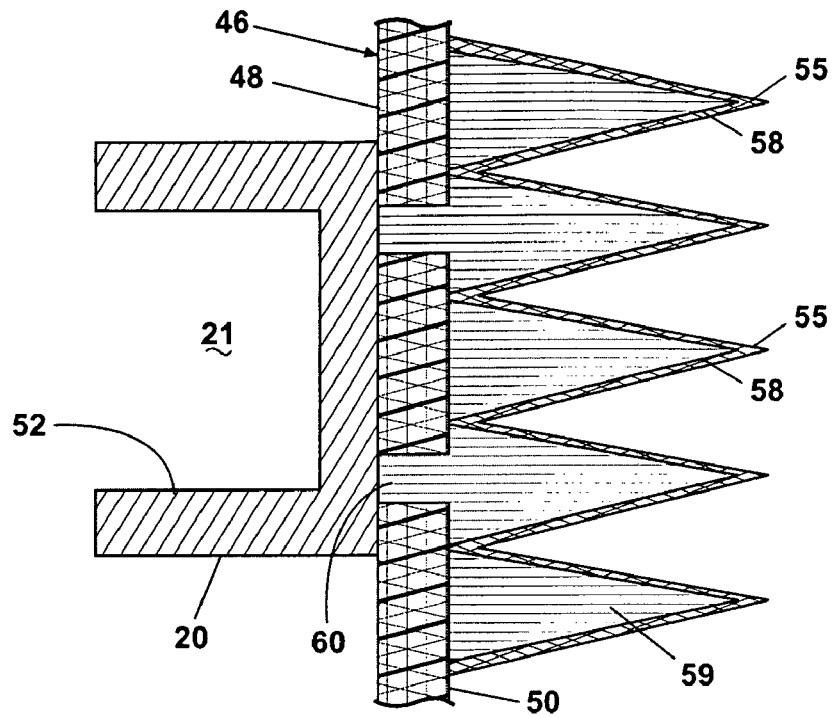
FIG. 5 is a cross-sectional view taken along the line 5-5 of a portion of the avionics chassis shown in FIG. 2.

FIG. 5 illustrates that the card rail 20 may be attached to the interior surface 48. The card rail 20 may be attached using fasteners, solders, brazes, welds, adhesives, or other attachment methods. If a structural adhesive is used, it will not have the necessary electrical conductivity and thus thermal sprayed aluminum, another thermal sprayed metal, or a metal applied by another means may be applied along the card rail 20 to increase electrical conductivity between the card rail 20 and the interior surface 48 of the side walls 44 and 46.

The plurality of heat-dissipating fins 58 extend from the exterior surface 50 of the side walls 44 and 46. Because the carbon fiber in the avionics chassis 12 is encased in the epoxy matrix, the resulting structure has the structural and weight benefits of the carbon fiber but not the thermal conductivity benefits. In this embodiment, the side walls 44 and 46 are integrated cold walls that help create a thermal management system to conduct heat from the interior 18 of the avionics chassis 12 to its exterior 19 where the heat may then be dissipated in the surrounding air through convection.

Figure 6:
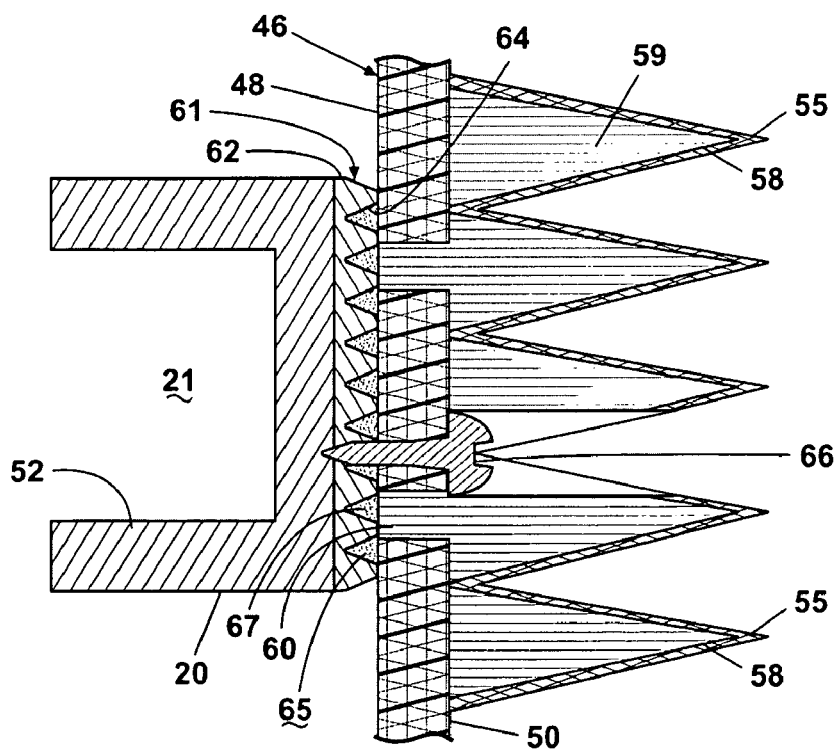
FIG. 6 is a cross-sectional view of a portion of the avionics chassis having an optional card rail mount for the card rails and forming a second embodiment of the invention.

While other configurations are possible, the heat-dissipating fins 58 are illustrated in FIGS. 2 and 5 as having the same orientation and commensurate in length to the card rails 20. For example, the heat-dissipating fins may run perpendicular to the card rails. The heat-dissipating fins 58 increase the exterior surface area of the side walls 44 and 46 allowing more heat to be transferred to the surrounding air through convection. The heat-dissipating fins 58 are schematically illustrated in FIGS. 4 through 6 as comprising a plurality of high-thermal conductivity carbon fibers 59 with isotropic orientation in the plane of the heat-dissipating fins 58. The use of the oriented carbon fibers gives the heat-dissipating fins 58 several times the thermal conductivity, yet significantly less weight, than an aluminum part of similar dimensions. For example, the isotropic carbon fibers 59 can have a high-thermal conductivity of approximately 1100 W/m-K.

The heat-dissipating fins 58 can be co-cured to the side walls 44 and 46 eliminating seams and improving thermal paths. To further improve thermal conductivity, a plurality of isotropic fibers of the heat-dissipating fins 58 may be extended at discrete sites from an interior of the heat-dissipating fins 58 to create tabs 60. These tabs 60 may be formed along the entire length of the heat-dissipating fin 58. The tabs 60 go through the side walls 44 and 46 to contact the card rails 20 located on the interior surface 48. The isotropic carbon fibers 59 form a direct conductive path from the card rail 20 to the heat-dissipating fins 58.

Not all of the heat-dissipating fins 58 in abutting contact with the exterior surface 50 have tabs 60 extending through the side walls 44 and 46 to the card rail 20. The plurality of isotropic carbon fibers 59 extending from the heat-dissipating fins 58 through the side walls 44 and 46 and in abutting contact with the card rail 20 is advantageous since it significantly improves heat transfer. Multiple tabs 60 from one heat-dissipating fin 58 may contact the card rail 20 down its entire length. Further, a plurality of tabs 60 from a plurality of heat-dissipating fins 58 are illustrated as abutting the single card rail 20 this also improves the amount of heat that may be conducted from the card rail 20.

FIG. 6 illustrates an alternative mounting of the card rails 20. More specifically a card rail mount 61 is provided on the card rail 20 and attached to the interior surface 48. The card rail mount 61 is illustrated as a pedestal 62 having a grooved surface 64. The card rail mount 61 may be adhered by at least one of a structural adhesive and a conductive adhesive to the card rail 20. Depending on the application, the same adhesive may provide both the desired structural and conductive properties.

The grooved structure 64 defines intervening interstitial spaces 65 that may receive thermally conductive adhesive 67 when the card rail mount 61 is adhered to the interior surface 48. This thermally conductive adhesive may touch the isotropic carbon fibers 59 to help form a conductive path from the card rail 20 to the heat-dissipating fins 58. Additionally, a plurality of fasteners 66, such as screws, may be inserted into the exterior surface 50 to provide mechanical reinforcement and ensure stability of the card rails 20.

Figure 7:
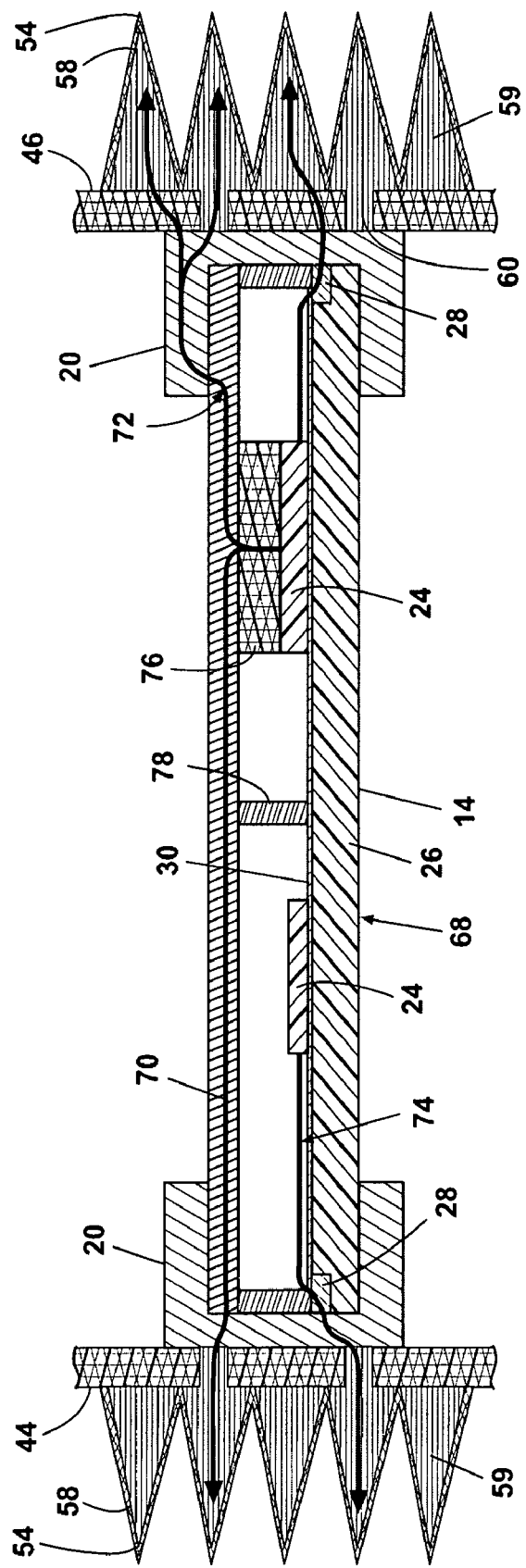
FIG. 7 is a cross-sectional view taken along the line 7-7 of a portion of the avionics chassis shown in FIG. 2.

FIG. 7 illustrates a portion of the avionics chassis 12 including a circuit card assembly 68, mounted in the slot 21, and having a thermal plane 70, a thermal pad 76, and stiffeners 78. The PCB 14 is illustrated as being mounted within the slot 21 with a thermal plane 70 also in the slot 21 and in overlying relationship with the PCB 14. In this manner, the PCB 14 defines a first primary plane, the thermal plane 70 defines a second primary plane, and the spatial relationship between the PCB 14 and the thermal plane 70 is such that the first and second primary planes are located within the slot 21 when the circuit card assembly 68 is received within the slot 21.

Figure 8:
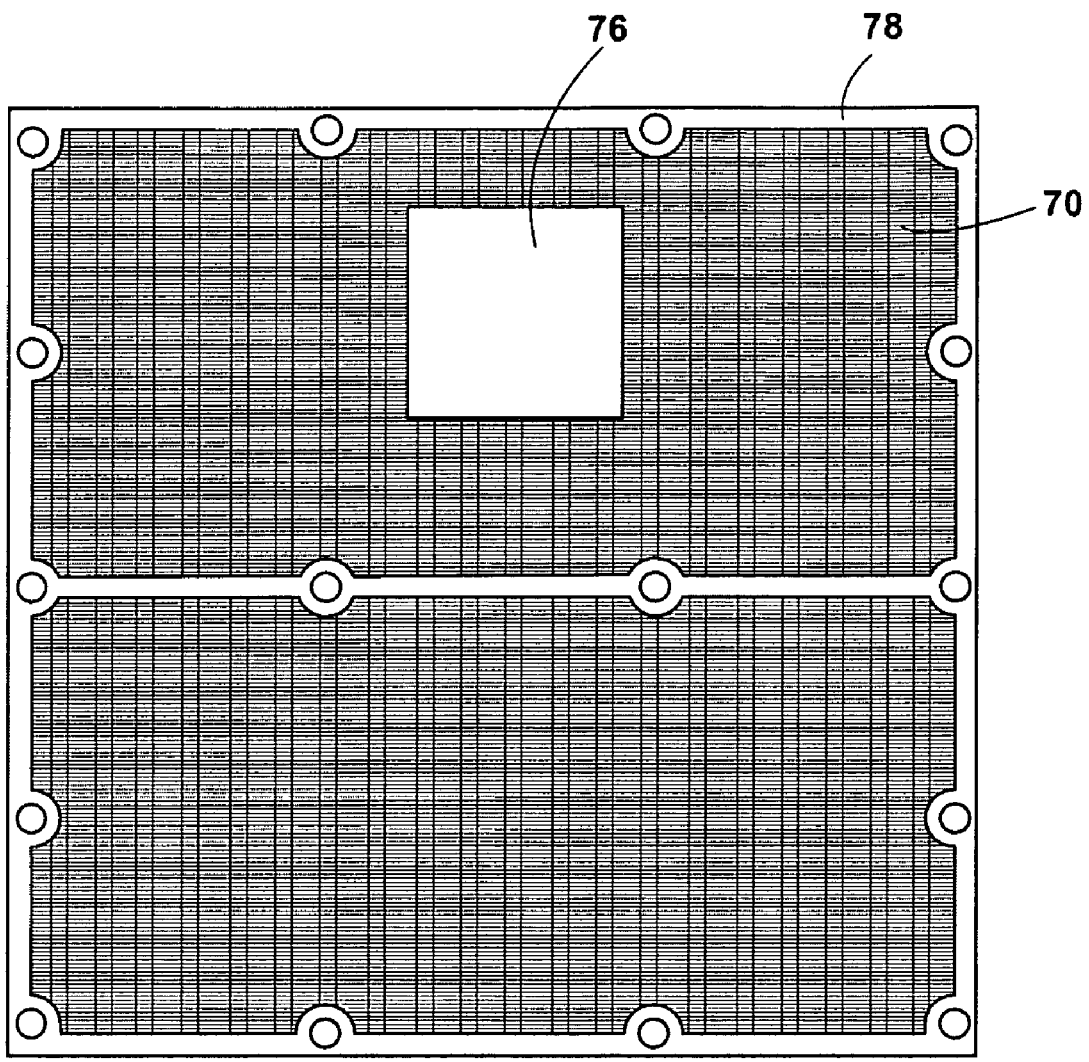
FIG. 8 is a bottom view of the thermal plane and stiffener shown in FIG. 7.

FIG. 8 better illustrates the thermal plane 70, the thermal pad 76, and the stiffeners 78. The thermal plane 70 is used to conduct heat away from the PCB 14. The thermal plane 70 can be comprised of a carbon fiber-reinforced composite as well as a carbon-carbon composite. For example, the thermal plane 70 may be comprised of pyrolytic carbon, which is highly thermally conductive. The carbon fibers may be laid up such that the thermal plane 70 is thermally conductive in the two-dimensional plane, that is it has in-plane (lateral) thermal conductivity that enables heat to dissipate in the x and y plane. It is also possible for the thermal plane 70 to have a lay-up of carbon fibers in 3D. The 3D lay-up would be more expensive but would facilitate the movement of heat away from the PCB 14. It has been contemplated that a one-dimensional lay-up may also be useful. No matter its configuration, the thermal plane 70 is intended to thermally conduct heat from the PCB 14 towards the card rails 20.

The thermal plane 70 may be attached to either the top or the bottom of the PCB 14. The thermal plane 70 may be mounted directly to the PCB 14 or through the thermal pad 76. The thermal pad 76 may be made of a carbon composite or any thermally conductivity material. For example, the thermal pad 76 may be made from 3D carbon-carbon composite. The thermal pad 76 may be located such that it directly contacts the heat-producing component 24.

The stiffener 78 is operably coupled to the PCB 14 so that the PCB 14 will not flex or vibrate within the slot 21. The stiffener 78 can be located between the PCB 14 and the thermal plane 70 when the circuit card assembly 68 is located within the slot 21. The stiffener 78 can also be located within one of the card rails 20 when the circuit card assembly 68 is located within the slot 21. The stiffener 78 may be comprised of aluminum or similar thermally conductive material and can have a variety of configurations to provide support for the PCB 14. Although the thermal plane 70 has been illustrated as a plane, it has been contemplated that it may also be a bar or a strap. Furthermore, in alternate embodiments, any suitable shape stiffener 78 for strengthening the PCB 14 could be provided. For example, the stiffener 78 may be several bars that are not interconnected. The stiffener 78 can also be integral with the thermal plane 70.

Referring back to FIG. 7, when the circuit card assembly 68 is in the slot 21, the thermal plane 70 is conductively coupled to one of the card rails 20 to form a portion of a first conductive path 72 and the PCB 14 is conductively coupled to another of the card rails 20 to form a portion of a second conductive path 74. The first conductive path 72 begins with the heat-producing component 24; heat is conducted through the thermal pad 76 to the thermal plane 70, which in turn conducts that heat laterally to the card rails 20. The first conductive path 72 continues through the card rails 20 to either the isotropic carbon fibers 59 in the tabs 60 or the side walls 44 and 46 themselves. The heat conducted through the isotropic carbon fibers 59 in the tabs 60 is directly conducted to the exterior of the heat-dissipating fins 58. The heat conducted through the side walls 44 and 46 is conducted by the isotropic carbon fibers 59 in the heat-dissipating fins 58 to the exterior of the heat-dissipating fins 58. Heat may then be dissipated through convection into the air surrounding the heat-dissipating fins 58.

The second conductive path 74 begins with the heat-producing component 24; heat is then transferred through the interior paths 30 of the PCB 14 to the thermally conductive side strips 28. Although the arrows illustrated in FIG. 7 are offset from the interior paths 30, this is done for illustrative purposes and the interior paths 30 are actually a portion of the second conductive path 74. The arrow has merely been offset so that it does not obscure the interior paths 30 in the figure. The side strips 28 abut the card rail 20 and heat in turn conducts from the card rail 20 either through the side walls 44 and 46 to the exterior of the heat-dissipating fins 58 or through the tabs 60 to the exterior of the heat-dissipating fins 58. Heat may then be dissipated through convection into the air surrounding the heat-dissipating fins 58. Thus, the PCB 14 also acts as a heat spreader by itself. This allows the avionics chassis 12 to run much cooler with the additional conductive path provided by the thermal plane 70.

The height of the PCB 14 is such that the PCB 14 and thermal plane 70 are both received within the channel 52. As illustrated in FIG. 7, the PCB 14 is in direct contact with the main portion of the card rail 20. The thermal plane 70 is in direct contact with the leg of the card rail 20 and in direct contact with the main portion of the card rail 20. Alternatively, the contact between the PCB 14 and the card rail 20 or the contact between the thermal plane 70 and the card rail 20 could be indirect contacts.

Figure 9:
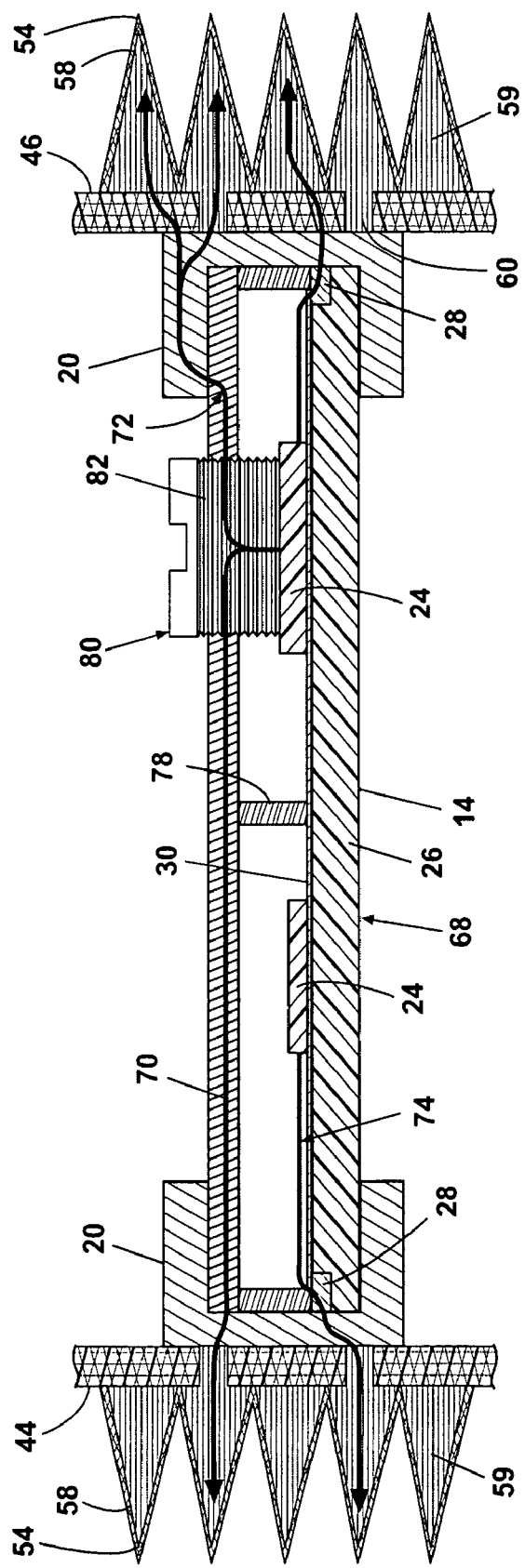
FIG. 9 is a cross-sectional view of a portion of the avionics chassis having an alternative thermal plane and thermal pad and forming a third embodiment of the invention.

FIG. 9 illustrates an alternative thermal pad comprising an adjustable thermal pad 80. The adjustable thermal pad 80 is illustrated as a screw contact 82. The lower portion of the screw contact 82 is adjustable relative to the PCB 14. Thus, the screw contact 82 may be lowered and raised such that it may accommodate heat-producing components 24 of varying heights.

Figure 10:
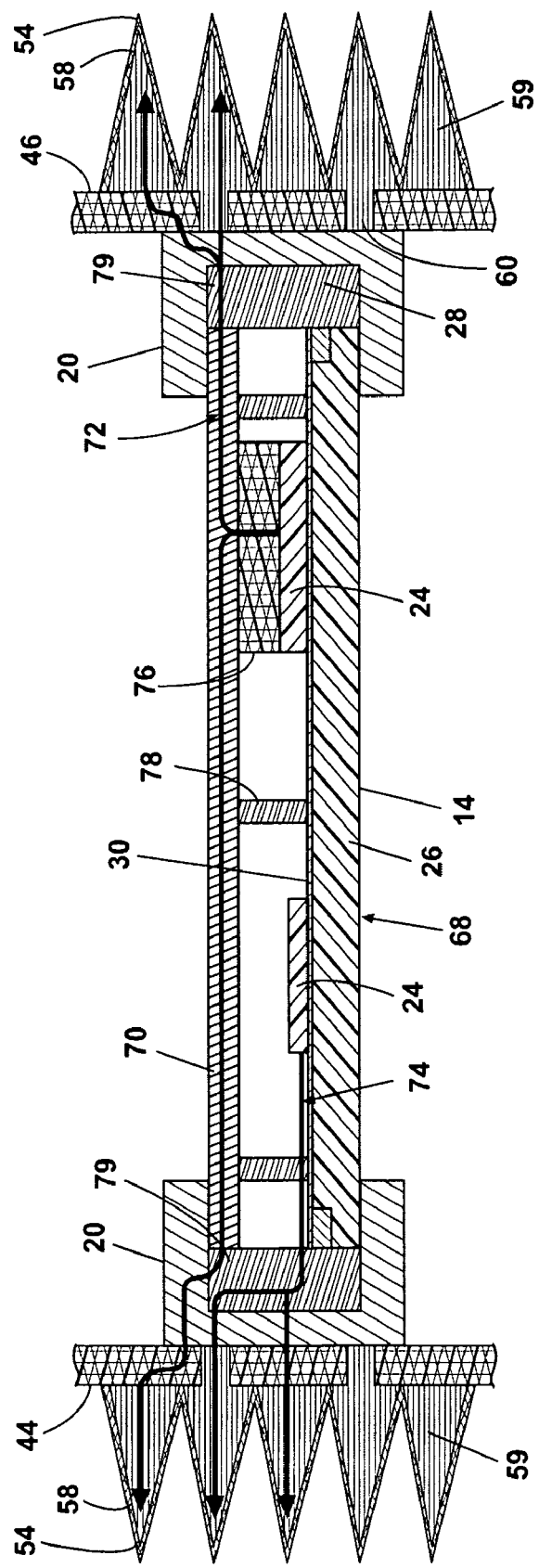
FIG. 10 is a cross-sectional view of a portion of the avionics chassis having optional attachment structures for the printed circuit board forming a fourth embodiment of the invention.

FIG. 10 illustrates an alternative mounting of the PCB 14 in the card rails 20. More specifically, wedge locks 79 may be used to connect the PCB 14 and the thermal plane 70 to the card rails 20. The wedge locks 79 may be made of aluminum or any similarly thermally conductive material. In this manner, the wedge locks 79 may become a portion of the first conductive path 72 and the second conductive path 74. For example, the second conductive path then begins with the heat-producing component 24; heat is then transferred through the interior paths 30 to the thermally conductive side strips 28. The side strips 28 abut the wedge locks 79, which in turn conduct heat to the card rail 20. The card rail 20 in turn conducts heat through the side walls 44 and 46 to the heat-dissipating fins 58. Heat may then be dissipated through convection into the air surrounding the heat-dissipating fins 58. Again, although the arrows illustrated in FIG. 9 are offset from the interior paths 30, this is done for illustrative purposes and the interior paths 30 are actually a portion of the second conductive path 74.

With either embodiment, the height of the components of the circuit card assembly 68 should be selected such that the entirety of the circuit card assembly 68 is located within the slot 21. This gives the circuit card assembly 68 a low profile design. This will allow more circuit card assemblies 68 to be placed in the avionics chassis 12. As the amount of circuit card assemblies 68 in the avionics chassis 12 increases the presence of the two thermally conductive paths 72 and 74 will help provide additional heat distribution from the PCB 14 and allow the avionics chassis 12 to run cooler.

Figure 11:
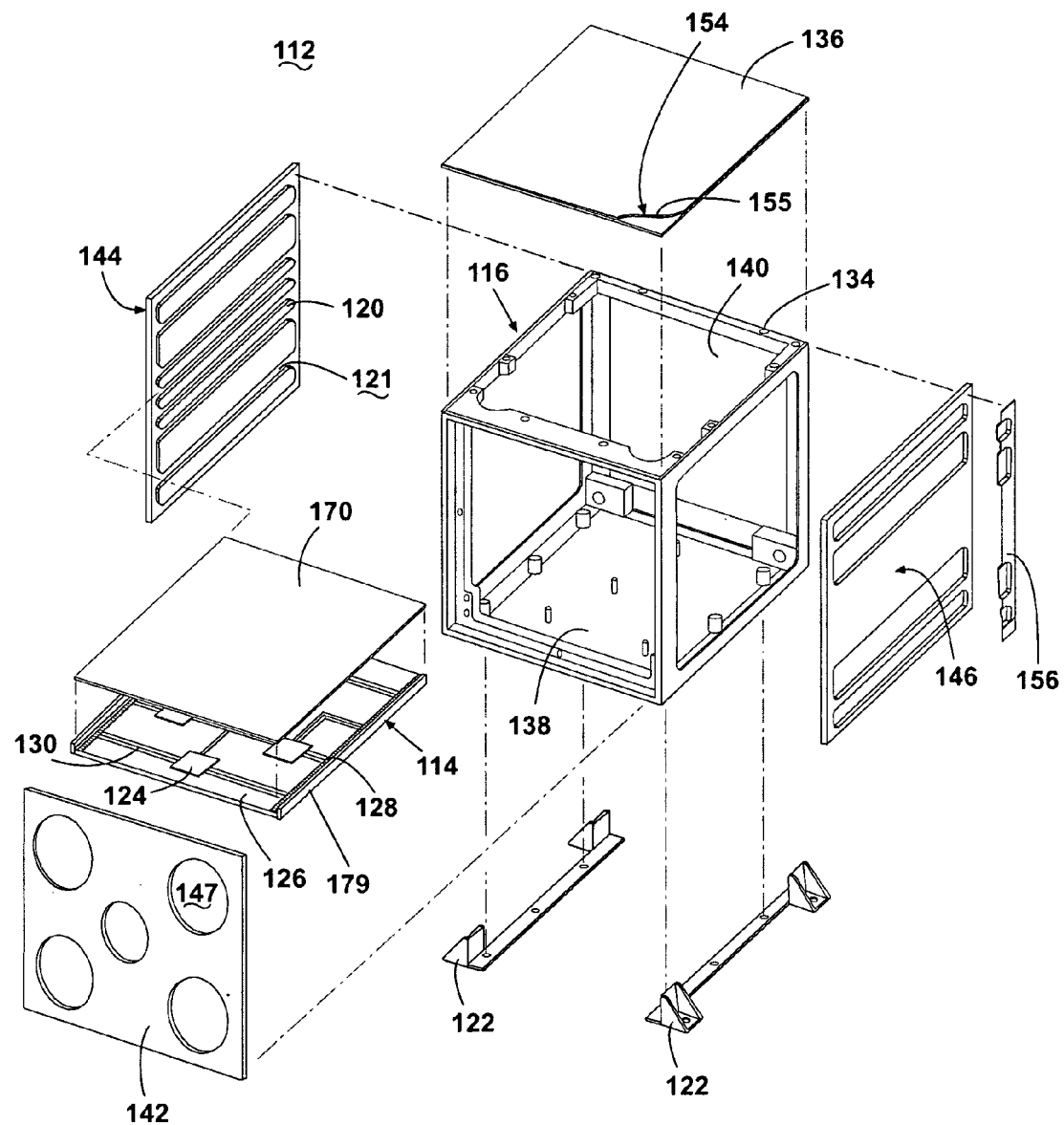
FIG. 11 is an exploded view of a fifth embodiment of the avionics chassis according to the invention.

FIG. 11 is an exploded view of an avionics chassis 112 having cold walls 144 and 146 according to a fifth embodiment of the invention. The fifth embodiment 100 is similar to the first embodiment 10. Therefore, like parts will be identified with like numerals increased by 100, with it being understood that the description of the like parts of the first embodiment applies to the second embodiment, unless otherwise noted.

One difference between the first embodiment 10 and the fifth embodiment 100 is that the cold walls 144 and 146 are discrete in that they are formed separately from the frame from a thermally conductive material. More specifically, the cold walls 144 and 146 are formed from a composite of carbon fibers in a carbonized epoxy matrix. Carbonized epoxy matrix composites have relatively high thermal conductivity properties in each axes compared to epoxy matrix composites; thermal conductivity is increased in the axes depending on the carbon fiber lay-up. The carbon fibers in the cold walls 144 and 146 are laid up such that the cold walls 144 and 146 are more thermally conductive in a two-dimensional plane. The carbon fibers in the carbonized matrix have excellent thermal properties in the x and y plane due to the fiber lay-up much like the thermal planes described above.

This configuration provides that the cold walls 144 and 146 may be formed from a higher thermal conductivity material than the remainder of the avionics chassis 112 and frame 134. The high thermal conductivity of the cold walls 144 and 146 results in the cold walls 144 and 146 being stiff but not strong. To make a whole avionics chassis out of the same material would require the whole avionics chassis 112 to be very thick to achieve the structural support necessary. Thus, the substantially thermally insulative frame 134 formed from carbon fibers laid up in an epoxy matrix gives the avionics chassis 112 its strength and the discrete cold walls 144 and 146 can provide the benefits of high thermal conductivity while not being required to provide such rigorous structural support.

Another difference is that card rails 120 are integrally formed on the interior surface 148 of the cold walls 144 and 146. The cold walls 144 and 146 are mounted to the 134 frame in opposing relationship such that corresponding card rails 120 on the cold walls 144 and 146 define a slot 121 therebetween. Thus, the cold walls 144 and 146 should be aligned perfectly such that the circuit card assemblies may fit within the slots 121. The discrete cold walls 144 and 146 may be assembled to the frame 134 using soldering, welding, brazing, adhesive, mechanical fasteners, or other similar attachment methods. Structural adhesive may be applied to fix the cold walls 144 and 146 to the frame 134 and an electrically conductive adhesive may be placed right next to the structural adhesive on the interior 118 of the avionics chassis 112 to electrically seal it. The cold walls 144 and 146 may also be metal plated, such as with nickel or aluminum, to provide better conductivity and to seal the carbon fibers against galvanic corrosion with aluminum wedge locks 179 on the PCBs 114.

Figure 12:
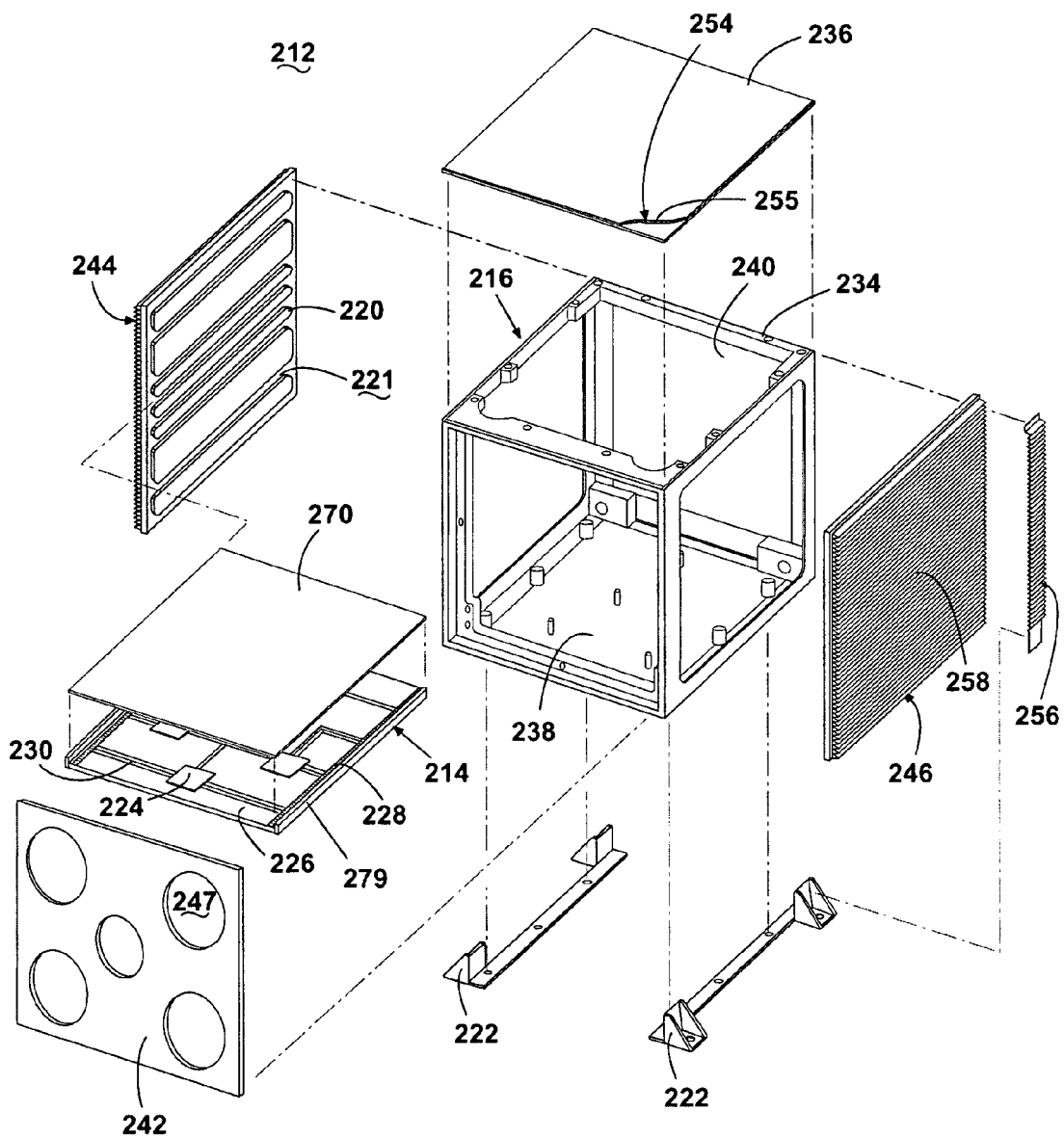
FIG. 12 is an exploded view of a sixth embodiment of the avionics chassis according to the invention.

FIG. 12 is an exploded view of an avionics chassis 212 having cold walls 244 and 246 according to a sixth embodiment of the invention. The sixth embodiment 200 is similar to the fifth embodiment 100. The difference being that the cold walls 244 and 246 include heat-dissipating fins 258 to increase the surface area of the exterior surface 250 of the cold walls 244 and 246. The cold wall surface area may also be increased with pins or other similar methods.

From a weight perspective, a carbon fiber composite avionics chassis 12 is more desirable than a heavier aluminum version. However, the carbon fiber composite version is less desirable than an aluminum version because of the poorer thermal and electrical conductivity characteristics. Thus, the various embodiments of carbon fiber composite avionics chassis disclosed herein are beneficial for an aircraft environment because of their weight reduction. The reduced weight avionics chassis also addresses all requirements related to electromagnetic interference (EMI), dissipating the heat generated by the avionics, protecting the avionics from lightning strikes, and protecting against environmental exposure, while still achieving a relatively low weight avionics chassis.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An avionics chassis assembly comprising:
    a housing having an outer surface, defining an exterior of the housing, an inner surface, defining an interior of the housing, at least one wall having inner and outer surfaces corresponding to the housing inner and outer surfaces, and made with carbon fiber reinforcement;
    at least one card rail for holding an electronic circuit board mounted to the inner surface of the housing;
    at least one heat-dissipating fin composed of carbon fiber and extending from the outer surface of the at least one wall and having a tab extending through the at least one wall and in abutting contact with the card rail; and
    a plurality of isotropic carbon fibers extending from an interior of the fin through the at least one wall of the housing and in abutting contact with the card rail;
    wherein the plurality of isotropic fibers extend through the tab and form a direct conductive path from the card rail to the heat-dissipating fin.

2. The avionics chassis assembly of claim 1, wherein the at least one heat-dissipating fin is co-cured to the housing.

3. The avionics chassis assembly of claim 1, further comprising a thermally conductive mount connecting the card rail to the inner surface of the wall and thermally conductively coupling the card rail to the isotropic carbon fibers to form part of the conductive path.

4. The avionics chassis assembly of claim 3, wherein the thermally conductive mount is located between the card rail and the inner surface of the at least one wall and defines a plurality of interstitial spaces in which a thermally conductive adhesive is located to form part of the conductive path.

5. The avionics chassis assembly of claim 1, wherein the at least one wall is metal plated.

6. The avionics chassis assembly of claim 1, further comprising a frame to which the at least one wall is mounted.

7. The avionics chassis assembly of claim 1, further comprising at least one other heat-dissipating fin projecting from the exterior of the at least one wall and wherein no plurality of isotropic carbon fibers extend through the at least one wall from the at least one other heat-dissipating fin.

8. The avionics chassis assembly of claim 7, wherein the at least one wall is formed from a carbon composite that conducts heat from the at least one card rail to the at least one other heat-dissipating fin.

9. The avionics chassis assembly of claim 1, wherein the isotropic carbon fibers have a thermal conductivity of about 1100 W/m-K.

10. The avionics chassis assembly of claim 1, wherein the at least one heat-dissipating fin parallels the card rail.

11. The avionics chassis assembly of claim 10, wherein the at least one heat-dissipating fin is of the same length as the card rail.

12. The avionics chassis assembly of claim 11, wherein the plurality of isotropic carbon fibers are arranged in groups spaced along the length of the heat-dissipating fin.

13. The avionics chassis assembly of claim 1, further comprising a plurality of heat-dissipating fins, each having a plurality of isotropic fibers conductively coupled to the at least one card rail.

14. An avionics chassis assembly comprising:
- a housing having an outer surface, defining an exterior of the housing, an inner surface, defining an interior of the housing, and made with carbon fiber reinforcement;
- at least one card rail for holding an electronic circuit board mounted to the inner surface of the housing;
- at least one heat-dissipating fin composed of carbon fiber, extending from the outer surface, paralleling the card rail and having the same length as the card rail; and
- a plurality of isotropic carbon fibers extending from an interior of the fin through the housing and in abutting contact with the card rail;
- wherein the plurality of isotropic fibers are arranged in groups spaced along the length of the heat-dissipating fin and the plurality of isotropic fibers form a direct conductive path from the card rail to the heat-dissipating fin.

15. The avionics chassis assembly of claim 14, further comprising at least one other heat-dissipating fin projecting from the exterior of the housing and wherein no plurality of isotropic carbon fibers extend through the housing from the at least one other heat-dissipating fin.

16. The avionics chassis assembly of claim 14, wherein the at least one heat-dissipating fin is co-cured to the housing.

17. The avionics chassis assembly of claim 14, wherein the isotropic carbon fibers have a thermal conductivity of about 1100 W/m-K.

18. The avionics chassis assembly of claim 14, further comprising a plurality of heat-dissipating fins, each having a plurality of isotropic fibers conductively coupled to the at least one card rail.

* * * * *